US 6,678,121 B2

(12) United States Patent
Lee et al.

(10) Patent No.: US 6,678,121 B2
(45) Date of Patent: Jan. 13, 2004

(54) FIBER REINFORCED LAMINATE ACTUATOR ARM FOR DISC DRIVES

(75) Inventors: Ernest Paul Lee, Boulder, CO (US);
Alexander Wei Chang, Longmont, CO (US); Khosrow Mohajerani, Boulder, CO (US); Michael Henry Lennard, Lyons, CO (US)

(73) Assignee: Seagate Technology LLC, Scotts Valley, CA (US)

( * ) Notice: Subject to any disclaimer, the term of this patent is extended or adjusted under 35 U.S.C. 154(b) by 280 days.

(21) Appl. No.: 09/896,282

(22) Filed: Jun. 28, 2001

(65) Prior Publication Data

US 2002/0021532 A1 Feb. 21, 2002

Related U.S. Application Data

(60) Provisional application No. 60/214,703, filed on Jun. 27, 2000.

(51) Int. Cl.[7] ................................................. G11B 5/55
(52) U.S. Cl. ..................................... 360/265; 360/265.8
(58) Field of Search ............................... 360/264.7–265, 360/265.7–265.9, 266

(56) References Cited

U.S. PATENT DOCUMENTS

| | | | |
|---|---|---|---|
| 3,681,782 A | 8/1972 | Scanlon | 444/1 |
| 3,930,114 A | 12/1975 | Hodge | 174/52 FP |
| 4,058,844 A | 11/1977 | Dirks | 360/106 |
| 5,627,701 A * | 5/1997 | Misso | 360/265.8 |
| 5,870,258 A | 2/1999 | Khan et al. | 360/104 |
| 5,978,178 A | 11/1999 | Adley | 360/104 |
| 6,091,578 A | 7/2000 | Stole et al. | 360/106 |
| 6,404,596 B1 * | 6/2002 | McReynolds | 360/265.8 |

* cited by examiner

*Primary Examiner*—A. J. Heinz
(74) *Attorney, Agent, or Firm*—Merchant & Gould P.C.

(57) ABSTRACT

An actuator arm for a disc drive data storage device has an upper outer surface in a first plane, a lower outer surface in a second plane substantially parallel to the first plane, a peripheral outer surface substantially perpendicular to the first and second planes, and a voice coil embedded within the outer surfaces of the actuator arm. The actuator arm is used in a disc drive containing one or more data storage discs and preferably has a pre-amplifier embedded within the outer surfaces of the actuator arm as well as conductors preferably between the read/write head and the pre-amplifier within the outer surfaces of the actuator arm.

23 Claims, 9 Drawing Sheets

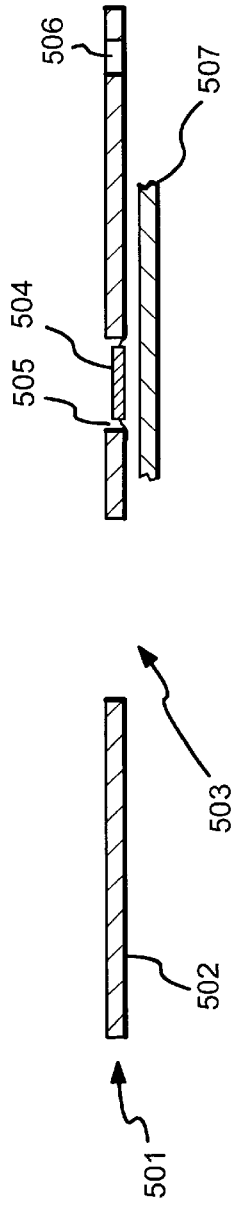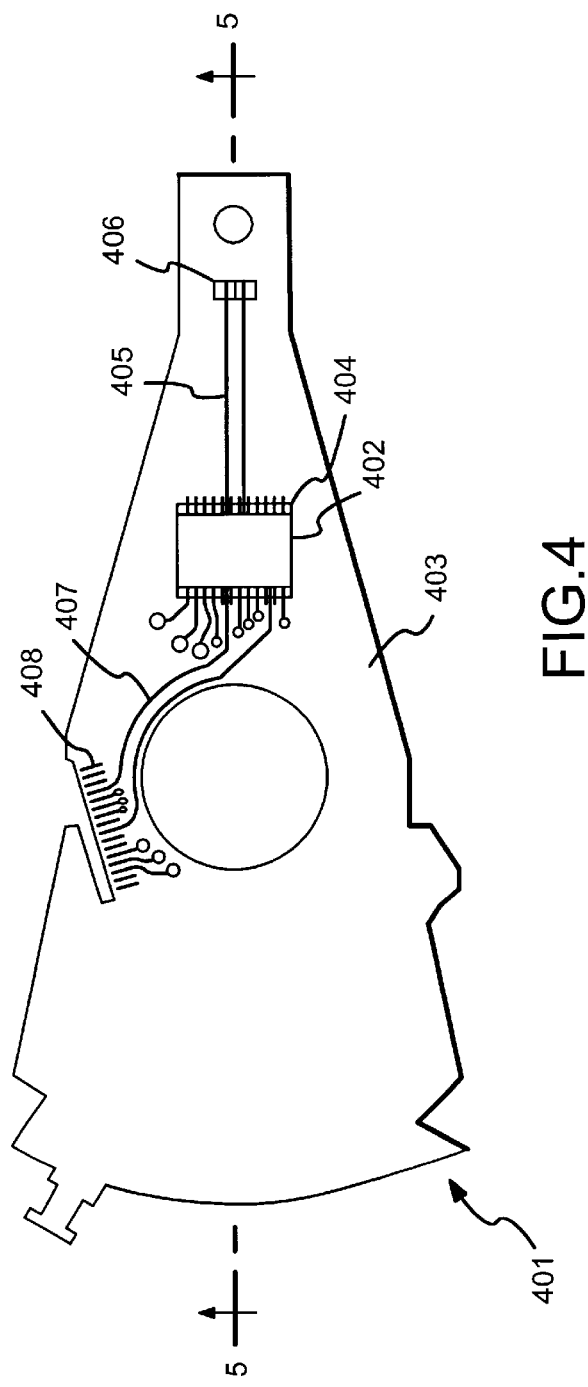

FIBER REINFORCED LAMINATE ACTUATOR ARM FOR DISC DRIVES

RELATED APPLICATIONS

This application claims the benefit of priority to provisional application Ser. No. 60/214,703, filed on Jun. 27, 2000 and entitled "Fiber-Reinforced Laminate Actuator For Disc Drives."

FIELD OF THE INVENTION

This application relates generally to disc drives and actuator arms for disc drives.

BACKGROUND OF THE INVENTION

Disc drives are used in workstations, laptops and personal computers to store large amounts of information in a readily accessible form. Typically, a disc drive includes a magnetic disc, which is rotated at a constant high speed by a spindle motor. The disc surfaces are divided into a series of concentric data tracks. Each data track can store information as magnetic transitions on the disc surface.

A disc drive also includes a set of magnetic transducers that are used to either sense existing magnetic transitions during a read operation or to create new magnetic transitions during a write operation. Typically, each magnetic transducer is mounted in a head, which is mounted onto one end of an actuator arm. A pre-amplifier, which amplifies read signals generated by the head, is connected to an outer surface of the actuator arm via a flexible element, which can accommodate movement of the head/actuator arm during operation. The actuator arm serves to selectively position the head over a particular data track to either read data from the disc or to write data to the disc.

Typically, the actuator arm is driven by a voice coil motor. The magnetic transducer, which is mounted in a head, is present at one end of an actuator arm, which extends radially outward from a substantially cylindrical actuator body. The actuator body is movably supported by a ball bearing assembly known as a pivot bearing assembly. The actuator body is parallel with the axis of rotation of the disc. The magnetic transducer, therefore, moves in a plane parallel to the disc surface.

The voice coil motor typically includes a coil, which is mounted on a surface of the actuator arm at an end opposite to the head. This coil is permanently immersed in a magnetic field resulting from an array of permanent magnets, which are mounted to the disc drive housing. Application of DC current to the coil creates an electromagnetic field, which interacts with the permanent magnetic field, causing the coil to move relative to the permanent magnets. The voice coil motor essentially converts electric current into mechanical torque. As the coil moves, the actuator arm also moves, causing the head to move radially across the disc surface. Control of the actuator arm movement is accomplished via a closed loop servo system.

Conventional actuator arms have been formed from homogenous metals, such as aluminum. In these actuator arms, the voice coil is attached to an exterior surface of the metal arm via an adhesive or some other bonding means. Other components of an actuator assembly, such as the Printer Circuit Cable (PCC) and the Flex On Suspension (FOS), are also connected to an exterior surface of the actuator arm. Such a construction has many mechanical and electrical disadvantages. First, the construction of a conventional actuator arm/voice coil assembly requires numerous individual components, which have to be manufactured separately and then assembled separately using an adhesive or some other bonding means. Further, due to the number of individual components in a conventional actuator assembly, such as the head and the pre-amplifier, a minimum number of interconnects between the individual components is necessary to provide electrical conductivity between the individual components.

Accordingly, there is a need in the art for an integrated actuator assembly for disc drives, wherein the number of individual components is minimized, and the number of interconnects between components is minimized. Further, there is a need in the art for an actuator assembly, which can be manufactured at low cost and high production without the need for many and/or multiple conventional process steps.

SUMMARY OF THE INVENTION

Embodiments of the present invention address some of the difficulties and problems discussed above by the discovery of an integrated actuator assembly comprising a low cost actuator arm, wherein one or more components of the actuator assembly are incorporated into the actuator arm. The integrated actuator assembly of one embodiment of the present invention minimizes the number of individual components and the number of interconnects between components. Further, the integrated actuator assembly of this embodiment of the present invention is made using a low cost, high output manufacturing process without the need for many conventional process steps, such as an adhesive bonding step.

Accordingly, an embodiment of the present invention is directed to an integrated actuator assembly comprising a low cost actuator arm, wherein one or more components of the actuator assembly are incorporated into the actuator arm.

Another embodiment of the present invention is further directed to a method of making an integrated actuator assembly comprising incorporating one or more electrical components of an actuator assembly into an actuator arm. The one or more electrical components may include a voice coil, one or more conductors, and other components, which are conventionally attached to outer surfaces of an actuator arm.

Embodiments of the present invention are also directed to a disc drive system comprising (a) at least one disc, and (b) at least one actuator arm, wherein the at least one actuator arm contains one or more components of an actuator assembly within exterior surfaces of the actuator arm.

Embodiments of the present invention may also be directed to a method of reading data from a disc or writing data to a disc using a disc drive system comprising (a) at least one disc, and (b) at least one actuator arm, wherein the at least one actuator arm contains one or more components of an actuator assembly within exterior surfaces of the actuator arm.

These and various other features as well as advantages, which characterize embodiments of the present invention will be apparent from a reading of the following detailed description and a review of the associated drawings.

BRIEF DESCRIPTION OF THE DRAWINGS

FIG. 4 is a plan view of a lower surface of an actuator arm of one embodiment of the present invention having a pre-amplifier mounted on the lower surface of the actuator arm;

FIG. 5 is a cross-sectional view of the actuator arm of FIG. 4 viewing the actuator arm along line 5—5 of FIG. 4;

DETAILED DESCRIPTION

Exemplary embodiments of the present invention are directed to an integrated actuator assembly and a disc drive comprising the integrated actuator assembly. The integrated actuator assembly contains one or more actuator arms, wherein at least one actuator arm contains one or more components of a conventional actuator arm assembly within exterior surfaces of the actuator arm. For example, a voice coil, which is usually bonded onto an exterior surface of a conventional actuator arm using an adhesive, may be incorporated into the actuator arm of an embodiment of the present invention such that the voice coil is completely contained within exterior surfaces of the actuator arm. Desirably, the actuator arm is formed from a fiber-reinforced composite material.

Embodiments of the present invention may be further directed to a method of making an integrated actuator arm assembly comprising forming two or more layers of material; and sandwiching one or more components of a conventional actuator arm assembly between the two or more layers of material. The manufacturing method of the present invention enables mass production of low cost actuator arms, without conventional process steps, such as an adhesive bonding step.

The integrated actuator assembly of these embodiments of the present invention may be used in a disc drive system for reading data from a disc or writing data to a disc. A disc drive containing the integrated actuator assembly of the present invention is described below.

Exemplary Disc Drive System

Figure 1:
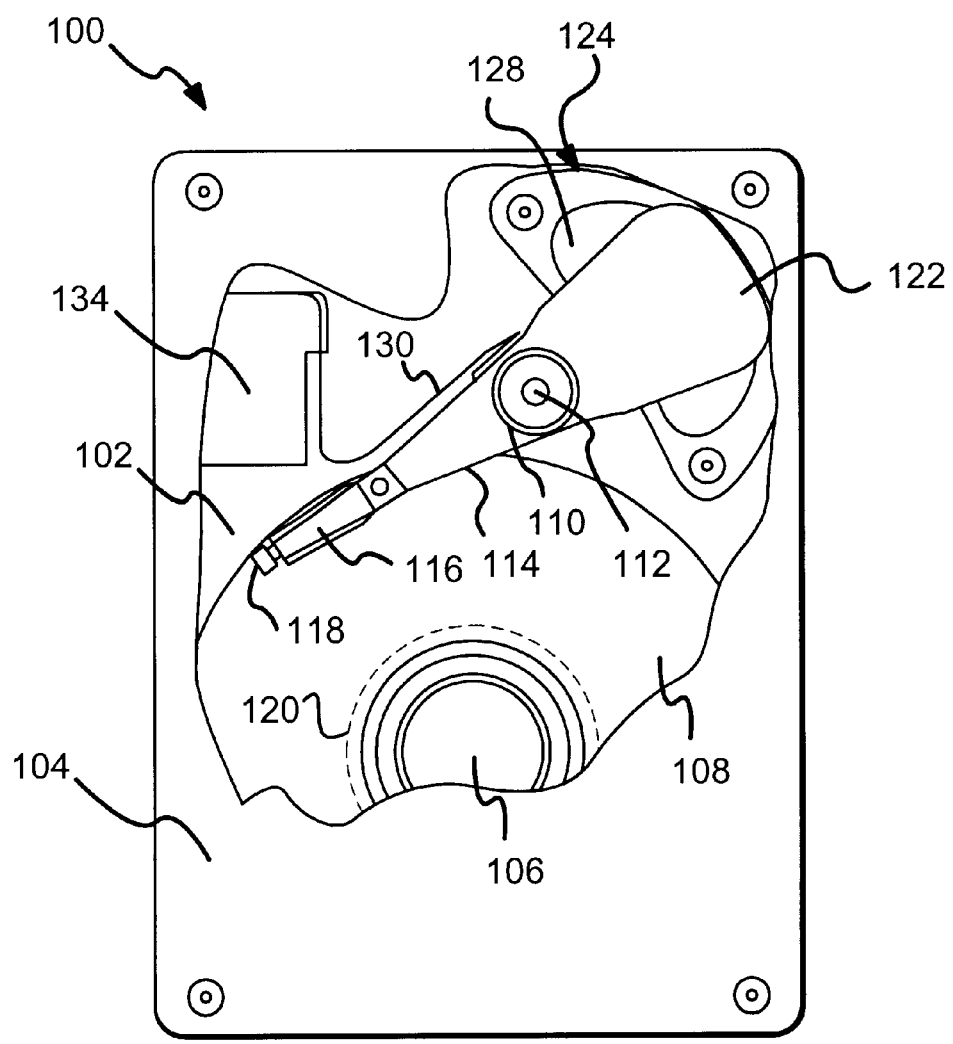
FIG. 1 is a plan view of an exemplary disc drive of one embodiment of the present invention showing the primary internal components.

An exemplary disc drive 100 constructed in accordance with one embodiment of the present invention is shown in FIG. 1. As in a conventional disc drive system, the disc drive 100 includes a base deck 102; a top cover 104, shown partially cut away; a spindle motor 106, which rotates one or more discs 108 at a constant high speed; an actuator assembly 110, which rotates during a seek operation about a bearing shaft assembly 112 positioned adjacent the discs 108; one or more actuator arms 114, which extend towards the discs 108; a head 118 mounted via a suspension 116 at a distal end of each of the actuator arms 114; a voice coil motor (VCM) 124; a voice coil (not shown) associated with each actuator arm 114; one or more permanent magnets 128; park zones 120 near the inner diameter of the discs 108; an actuator latch arrangement (not shown); a flex assembly 130; and a flex bracket 134 for communication through the base deck 102 to a disc drive printed circuit board (not shown) mounted to the bottom side of the disc drive 100.

Unlike a conventional disc drive system, the actuator arm 114 of embodiments of the present invention preferably have a voice coil embedded within outer surfaces of the actuator arm 114 at an end 122 opposite to head 118. In addition, embodiments of the actuator arm of the present invention may have other electrical components embedded within outer surfaces of the actuator arm or on an outer surface thereof, such as conductors connecting various parts of the actuator assembly. For example, in a conventional disc drive system, the disc drive system contains a flex assembly, which includes external components such as a printed circuit board to which head wires are connected; flexures; head wires, which are routed along an outer surface of actuator arms and the flexures to the heads; and a printed circuit board, which typically contains a pre-amplifier for amplifying read signals generated by the heads during a read operation. However, in the disc drive system of the present invention, such as shown in FIG. 1, head wires and flexures are simplified, while conductors, discrete components, and a pre-amplifier are incorporated into the actuator arm itself. An example of an actuator arm of one embodiment of the present invention is shown in FIG. 2.

Figure 2:
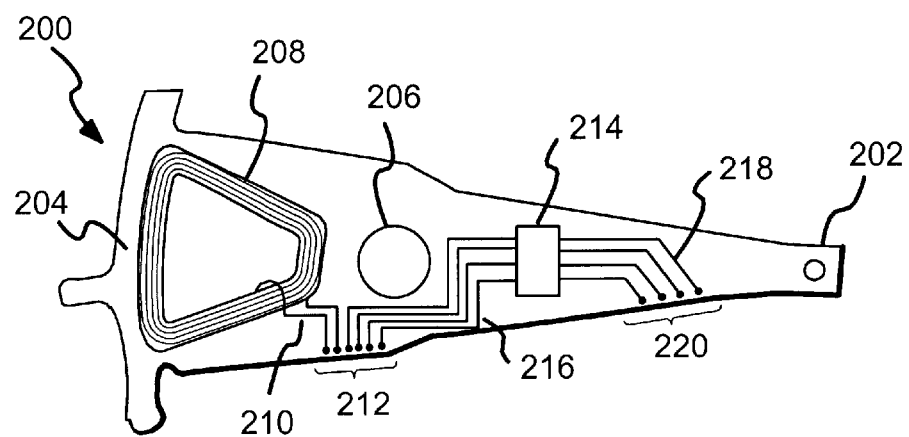
FIG. 2 is a plan view of an actuator arm of the embodiment of the present invention in FIG. 1.

The actuator arm 200, as shown in FIG. 2, comprises a distal end 202, an opposite end 204, and an opening 206, which fits onto a bearing shaft assembly (not shown). A voice coil 208 is embedded within exterior surfaces of actuator arm 200 at the opposite end 204. In addition, the following electrical components are embedded within and between exterior surfaces of the actuator arm 200 as shown in FIG. 2: conductors 210 leading from voice coil 208 to an exterior surface of actuator arm 200, forming contacts 212 for connecting to a flex assembly (not shown); a pre-amplifier 214 for amplifying read signals generated by a transducer or head (not shown) during a read operation; conductors 216 leading from the pre-amplifier 214 to an exterior surface of actuator arm 200 forming contacts 212 for connecting the conductors to a flex assembly (not shown); and conductors 218 leading from the pre-amplifier 214 to an exterior surface of actuator arm 200 forming contacts 220 for connecting to a transducer head assembly (not shown), wherein conductors 218 provide electrical communication of write currents applied to the head during a write operation, and of read signals generated by the head (not shown) during a read operation.

Figure 3:
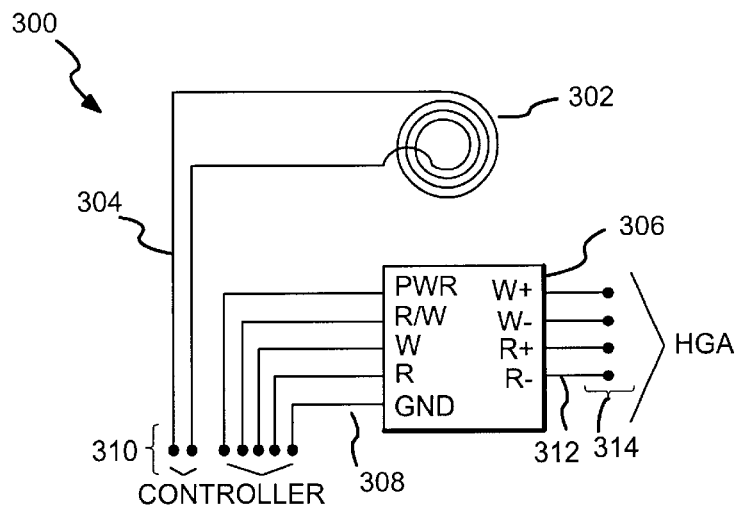
FIG. 3 is a partial electrical schematic of an actuator assembly of an embodiment of the present invention.

The actuator arm in embodiments of the present invention may contain a variety of electrical components and conductors within and between exterior surfaces of the actuator arm depending on the desired function of the actuator arm. In one embodiment of the present invention, the actuator arm contains an electrical system as shown in FIG. 3. The electrical schematic 300 of FIG. 3 contains the following electrical components: voice coil 302; conductors 304 leading from voice coil 302 to a controller (not shown) via a flex assembly (not shown); pre-amplifier 306; conductors 308 leading from pre-amplifier 306 to a controller (not shown) via a flex assembly (not shown); contacts 310 for connecting to a controller (not shown) via a flex assembly (not shown); conductors 312 leading from pre-amplifier 306 to a head assembly (not shown); and contacts 314 for connecting to a head assembly (not shown).

The actuator arm of embodiments of the present invention may be formed from a fiber-reinforced composite material comprising at least one fiber component and at least one matrix component. The fiber component may be in the form of continuous fibers or discontinuous fibers. As used herein, the term "continuous fibers" refers to fibers having a length of greater than about 12.7 cm (5 inches), and "discontinuous fibers" refers to fibers having a length of about 12.7 cm (5 inches) and less. The fibers may be arranged in any conventional manner including, but not limited to, a woven fabric, a non-woven web or mat, unidirectionally arranged monofilaments or fibers, yarns, roving, chopped fiber, pulp, spun-laced sheet, wet-laid paper, and the like.

The fiber material may be any known natural or man-made reinforcing fiber material. Suitable fiber material for use in embodiments of the present invention include, but are not limited to, carbon; graphite; aramid; glass; quartz; silicon carbide; boron; alumina; metal-coated carbon; metal, such as stainless steel, boron, copper, nickel, etc.; and any combination thereof. The fibers are available from a variety of suppliers. Desirably, the fibers comprise carbon, glass, or aramid fibers. More desirably, the fibers comprise glass fibers.

The matrix material may be any conventional thermoplastic or thermosetting material. Suitable thermoplastic materials include, but are not limited to, acetal resins, polyamides, polyimides, polyamide imides, polyether imides, polyethers, polyesters, polycarbonates, polyarylene sulfides, polysulfones, polyarylsulfones, polketones, polyolefins, vinyls, and acrylics. Suitable thermosetting materials for use as a matrix material in the present invention include, but are not limited to, epoxy resins, polyester resins, polyimide resins, and phenolic resins. Desirably, the matrix material comprises a thermosetting material. More desirably, the matrix material comprises an epoxy resin.

Desirably, the fiber reinforced composite material used to form the actuator arm of the present invention comprises a prepreg material. As used in embodiments of the present invention, a prepreg may be defined as a fiber-reinforced, self-supporting, heat and pressure processable layer comprising a matrix resin material, such as described above, and reinforcing fibers. The prepreg layer may be in the form of a sheet, film, ribbon, or like physical form, wherein the reinforcing fibers associated with the matrix resin material are in one or more physical forms including, but not limited to, a woven fabric, a non-woven web or mat, or unidirectionally arranged fibers or monofilaments.

Any known prepreg forming method may be used to prepare prepregs for use in the present invention. Examples of suitable methods include, but are not limited to, (a) a slurry impregnation procedure for making stackable sheets as disclosed in U.S. Pat. No. 4,522,875 issued to Still et al.; (b) a pultrusion process as disclosed in U.S. Pat. No. 4,680,224 issued to O'Connor; (c) a compaction belt method as disclosed in U.S. Pat. No. 4,622,192 issued to Ma; and (d) an extrusion compacting roller process as disclosed in U.S. Pat. No. 4,269,884 issued to Della Vecchia et al.

The fiber and matrix content of the composite material used to form the actuator arm of the present invention may vary as desired. Typically, the fibers are present in an amount ranging from about 5 to 90 weight percent, while the matrix material is present in an amount ranging from about 95 to 10 weight percent, based on a 100 weight percent total composite weight basis. Desirably, the fiber reinforced composite material comprises fibers in an amount ranging from about 5 to about 40 weight percent, and matrix material in an amount ranging from about 95 to 60 weight percent, based on a 100 weight percent total composite basis. More desirably, the fiber reinforced composite material comprises fibers in an amount ranging from about 10 to 20 weight percent, and matrix material in an amount ranging from about 90 to 80 weight percent, based on a 100 weight percent total composite basis.

It should be noted that other materials may be added to the fiber reinforced composite material as needed to tailor the composite material as desired for structural and damping characteristics. Suitable additives may include, but are not limited to, additives, lubricants, stabilizers, fillers, additional fiber reinforcement agents, impact modifiers, flame retardants, colorants, anti-microbial agents, and the like. If and when employed, the total amount of additives present in the fiber reinforced composite material is usually less than about 15 weight percent based on the total weight of the fiber reinforced composite material.

As discussed above, one aspect of embodiments of the present invention is an integrated actuator assembly comprising a low cost actuator arm, wherein one or more components of a conventional actuator assembly are either incorporated into the actuator arm or eliminated altogether. Suitable components, which may be incorporated into the actuator arm of the present invention include, but are not limited to, a voice coil; a pre-amplifier for amplifying read signals generated by a head during a read operation; one or more conductors, such as conductors leading from the voice coil to an exterior surface of the actuator arm for connecting to a flex assembly, conductors leading from the pre-amplifier to an exterior surface of the actuator arm for connecting to a flex assembly, and conductors leading from the pre-amplifier to an exterior surface of the actuator arm for connecting to a head assembly for controlling the write currents to the head during a write operation and the read currents generated by the head during a read operation; and discrete components, such as resistors, capacitors and inductors.

In one desired embodiment of the present invention, the actuator arm has the following components embedded within outer surfaces of the arm: a voice coil; a pre-amplifier for amplifying read signals generated by a head during a read operation; conductors leading from the voice coil to an exterior surface of the actuator arm for connecting to a flex assembly; conductors leading from the pre-amplifier to an exterior surface of the actuator arm for connecting to a flex assembly; and conductors leading from the pre-amplifier to an exterior surface of the actuator arm for connecting to a head assembly for controlling the write currents to the head during a write operation and the read currents generated by the head during a read operation. The number of turns and the resistance of the voice coil may be optimized by varying one or more of the following parameters: the conductor thickness, the conductor width, the conductor material and the number of laminate layers. Further, the ability to incorporate the above-mentioned conductors into the body of the actuator arm enables a reduction in the number of interconnects between the pre-amplifier and the head, and the actuator arm and the flex assembly.

A reduction in the number of interconnects between the head and the pre-amplifier results in a reduction in the amount of noise introduced into the read/write signal. Consequently, the actuator arm of this embodiment of the present invention enables optimization of the ratio between the signal and the noise floor, otherwise known as the signal-to-noise ratio (SNR). In addition, since the current head wire/Flex on Suspension are long conductors, which act like antennas picking up more noise, it is desirable to minimize the length of these conductors. By locating the pre-amplifier on the actuator arm in embodiments of the present invention in a closer proximity to the head, noise is reduced further, resulting in a further increase in the SNR.

In a further embodiment of the present invention, the actuator assembly comprises the above-described actuator arm and a head assembly attached directly to the actuator arm. The head assembly, which typically comprises a head and a suspension, may be attached to the actuator arm by any known method of attaching including, but not limited to, soldering, swage, laser weld, ball bond, and adhesives. Desirably, the head assembly is attached to the actuator arm by a soldering process. Suspension conductors leading from the head to an exterior surface on the suspension, forming contacts on an exterior surface on the suspension, may be aligned with corresponding contacts on the actuator arm to electrically connect the head assembly to the pre-amplifier located in the actuator arm.

In yet a further embodiment of the present invention, the actuator assembly comprises an actuator arm as shown in FIG. 4. In the actuator arm 401 of FIG. 4, the pre-amplifier 402 is mounted on a bottom surface 403 of the actuator arm 401 within an opening 404 in actuator arm 401. The pre-amplifier 402 is mounted on a bottom surface 403 of actuator arm 401, while maintaining sufficient clearance from a rotating media (i.e., a rotating disc) (not shown). Bottom-mounting of the pre-amplifier 402 has a number of advantages including, but not limited to, (1) the elimination of vias (i.e., plated through holes from one side of the actuator arm to the other side typically needed for connections between a top-surface mounted pre-amplifier and the head assembly) for connections between the pre-amplifier and the head assembly; (2) improved high frequency signals due to the elimination of vias, which have a parasitic inductive property; and (3) an improved flex circuit design, which only requires a 90 degree bend (shown in FIG. 7 below) in the flex circuit as opposed to a conventional 180 degree bend (shown in FIG. 6 below) in the flex circuit, further improving high frequency signals due to the elimination of tight bends, which have a parasitic inductive property. As shown in FIG. 4, the bottom-mounted pre-amplifier 402 and the FOS contacts 406 for the head assembly (not shown) may be electrically connected to one another through conductors 405. Further, bottom-mounted pre-amplifier 402 and flex circuit contacts 408 may be electrically connected to one another through conductors 407. In both cases, the pre-amplifier may be connected to other actuator arm components without the need for vias.

FIG. 5 displays a cross-sectional view of the actuator arm of FIG. 4 along line 5—5. As shown in FIG. 5, actuator arm 501 comprises a bottom surface 502; an opening 503, which fits onto a bearing shaft assembly (not shown); a bottom-mounted pre-amplifier 504 positioned within opening 505; and optional swage hole 506. For illustrative purposes, a rotating media 507 is shown below bottom surface 502 and pre-amplifier 504, and positioned a distance from pre-amplifier 504.

Figure 6:
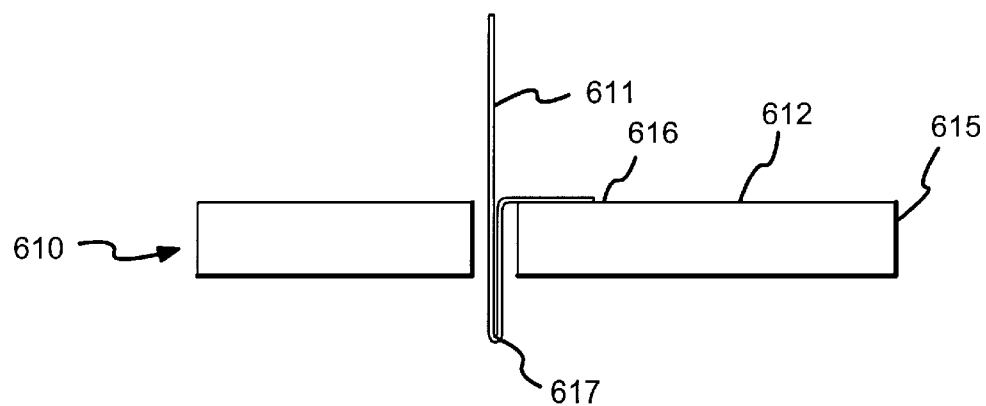
FIG. 6 is a side view of an actuator arm having a flex circuit with a 180 degree bend.
Figure 7:
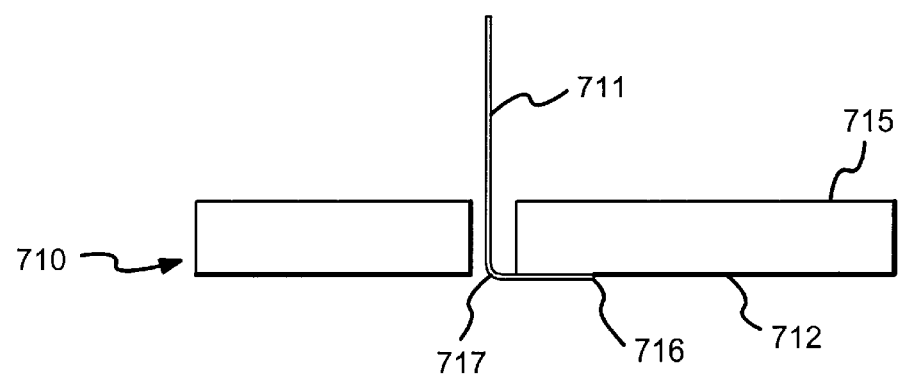
FIG. 7 is a side view of an actuator arm having a flex circuit with a 90 degree bend.

As discussed above, a bottom-mounted pre-amplifier enables the use of a 90 degree bend in a flex circuit as opposed to a 180 degree bend as found in most conventional actuator arm assemblies. FIGS. 6 and 7 display two separate actuator arm assemblies 610 and 710. In FIG. 6, actuator assembly 610 comprises a flex circuit 611, which is connected to a top surface 612 of actuator arm 615 at point 616 on top surface 612. Flex circuit 611 has a 180 degree bend 617, which increases the amount of parasitic inductance within the actuator assembly. In contrast, in actuator arm assembly 710 of FIG. 7, flex circuit 711 is connected to a bottom surface 712 of actuator arm 715 at point 716 on bottom surface 712. Flex circuit 711 has a 90 degree bend 717, which minimizes the amount of parasitic inductance within the actuator assembly.

The actuator assembly in an embodiment of the present invention may further comprise an actuator arm having a bottom-mounted pre-amplifier, as shown in FIG. 4, and a thermal heat sink associated with the bottom-mounted pre-amplifier. In the actuator arm 801 of FIG. 8, a pre-amplifier 802 is mounted on a bottom surface (not shown) of actuator arm 801 within an opening 803 in actuator arm 801. A heat sink/stiffener 804 is mounted over pre-amplifier 802 and connected to a top surface 805 of actuator arm 801 by one or more solder tabs 806. The heat sink/stiffener 804 provides improved thermal and structural stabilization to the actuator assembly. Although pre-amplifier 802 generates heat during operation, pre-amplifier 802 is cooled by convective cooling resulting from airflow generated by a rotating disk (not shown), as well as, conductive cooling through the heat sink/stiffener 804.

Figure 8:
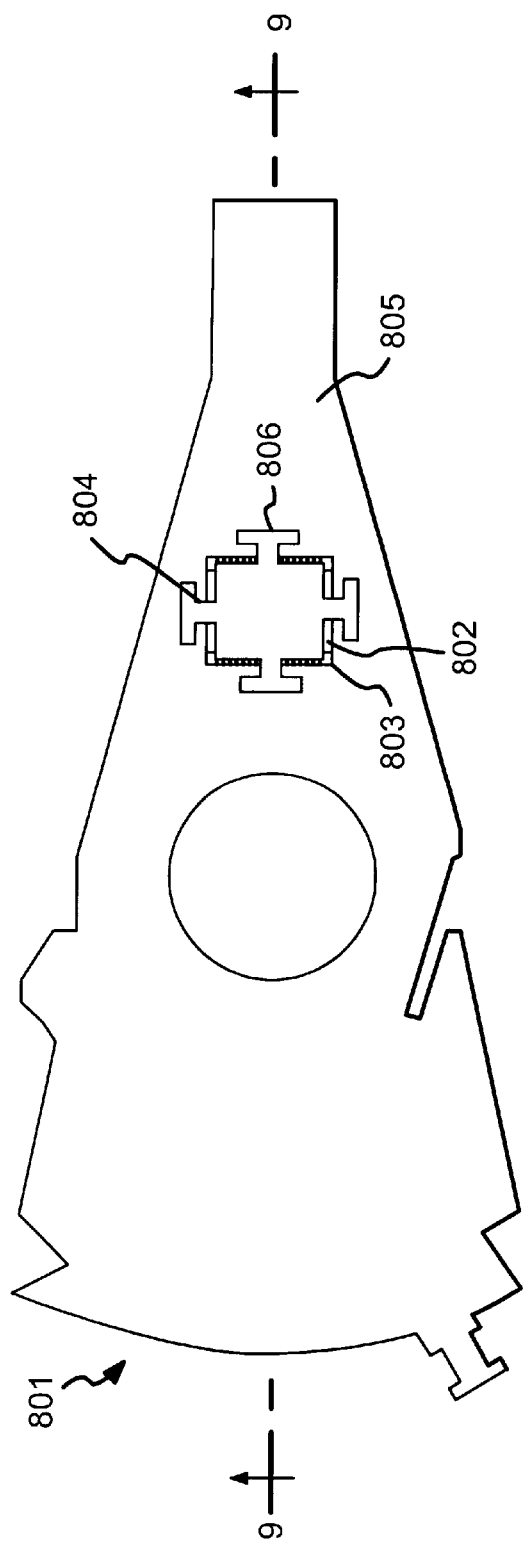
FIG. 8 is a plan view of an actuator arm of one embodiment of the present invention having a pre-amplifier mounted on a bottom surface of the actuator arm and a thermal heat sink/stiffener mounted on a top surface of the actuator arm.
Figure 9:
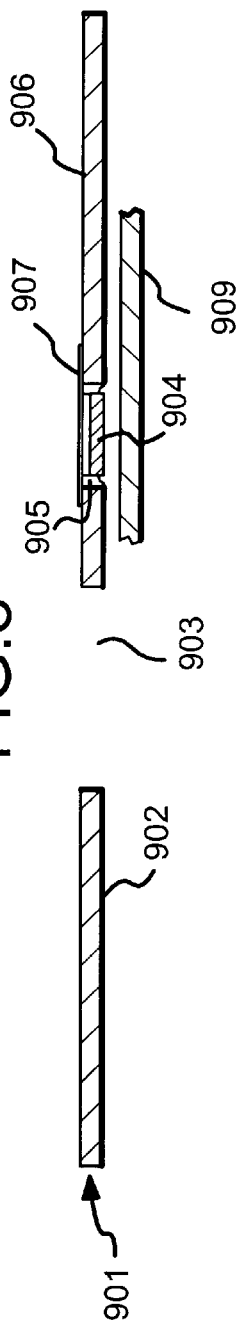
FIG. 9 is a cross-sectional view of the actuator arm of FIG. 8 viewing the actuator arm along line 9—9 of FIG. 8.

FIG. 9 displays a cross-sectional view of the actuator arm of FIG. 8 along line 9—9. As shown in FIG. 9, actuator arm 901 comprises a bottom surface 902; an opening 903, which fits onto a bearing shaft assembly (not shown); a bottom-mounted pre-amplifier 904 positioned within opening 905; top surface 906; and heat sink/stiffener 907. For illustrative purposes, a rotating media 909 is shown below bottom surface 902 and pre-amplifier 904, and positioned a distance from pre-amplifier 904.

As discussed in reference to the head assembly above, the pre-amplifier and heat sink/stiffener may also be attached to the actuator arm by any known method of attaching including, but not limited to, soldering, swage, laser weld, ball bond, and adhesives. Desirably, the pre-amplifier and heat sink/stiffener are both attached to the actuator arm by a soldering process.

It should be noted that any of the above-described electrically conductive components may comprise any known conductive material including, but not limited to, aluminum, steel, beryllium, gold, silver, and copper. Desirably, the above-described electrically conductive components, including the voice coil and the conductors, comprise copper due to its conductivity and processing advantages.

The actuator arm of an embodiment of the present invention may have a shape and dimensions similar to known actuator arms. A typical shape is shown in FIG. 2. Any suitable shape may be used as long as the shape allows for the incorporation of a voice coil and other components into the actuator arm. Although the actuator arm can be of any size and dimension, typically, the actuator arm has an overall length of less than about 10 cm (about 4 inches), an overall width (i.e., across the widest portion of the actuator arm) of less than about 5 cm (about 2 inches), and a thickness of less than about 3 mm (about 0.12 inches). Desirably, the actuator arm in one preferred embodiment of the present invention (excluding the head assembly) has an overall length of about 8 cm (about 3.15 inches), an overall width of about 4 cm (about 1.57 inches), and a thickness of about 2 mm (about 0.08 inches).

Desirably, the actuator arm of this embodiment of the present invention is formed from fiber reinforced composite material. The number of layers of fiber reinforced composite material used to form the actuator arm may vary depending on a number of factors including, but not limited to, the thickness of each composite layer; the composite materials; the desired configuration of the voice coil within the actuator arm; and the desired properties of the actuator arm, such as damping characteristics, stiffness, volume, and weight. Desirably, the number of layers of fiber reinforced composite material used to form the actuator arm of embodiments of the present invention is from about 2 to about 20 layers. More desirably, the number of layers of fiber reinforced composite material used to form the actuator arm of a preferred embodiment of the present invention is from about 2 to about 10 layers. Even more desirably, the number of layers of fiber reinforced composite material used to form the actuator arm is from about 2 to about 5 layers.

Figure 10:
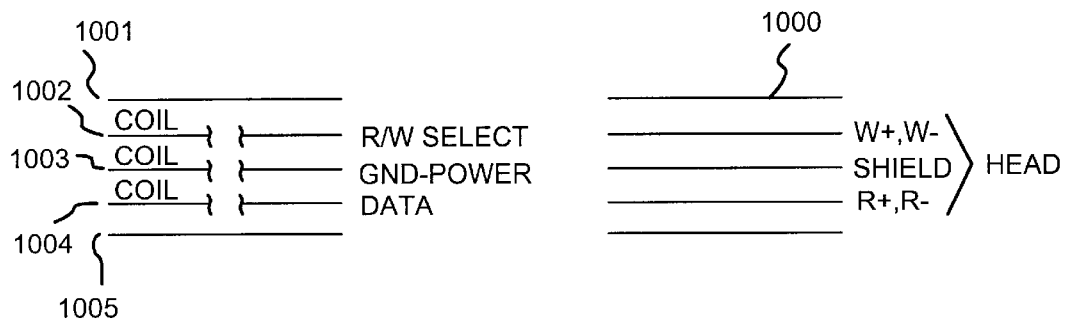
FIG. 10 is a view of the layer configuration of an actuator arm of the present invention.

One example of an actuator arm of the present invention contains 5 layers of fiber reinforced composite material. A cross-section of this particular actuator arm is shown in FIG. 10. Cross-section 1000 illustrates the five layers: upper layer 1001; intermediate layers 1002, 1003, and 1004; and lower layer 1005. Upper layer 1001 provides a protective layer, which covers at least some of the electrical components within the actuator arm. Intermediate layer 1002 contains a portion of a voice coil, conductors leading from an exterior surface of the actuator arm to a pre-amplifier (not shown) for receiving read/write select signals from a flex assembly (not shown) instructing the pre-amplifier to receive and send signals to a select head; and conductors leading from the pre-amplifier to the head (not shown) for controlling positive and negative write values applied to the head from a differential pre-amplifier during a write operation. Intermediate layer 1003 contains a portion of a voice coil, conductors providing power to the pre-amplifier, conductors providing a ground for the pre-amplifier, and a shielding component. Desirably, the shielding component comprises a film or foil of copper, which absorbs stray signals, if any, between adjacent, signal-carrying traces. Intermediate layer 1004 contains a portion of a voice coil, conductors leading from a pre-amplifier to an exterior surface of the actuator arm for providing data to a flex assembly; and conductors leading from the pre-amplifier to the head (not shown) for providing read signals generated by the heads to the pre-amplifier during a read operation. Lower layer 1005 provides another protective layer, which covers at least some of the electrical components within the actuator arm.

Figure 11:
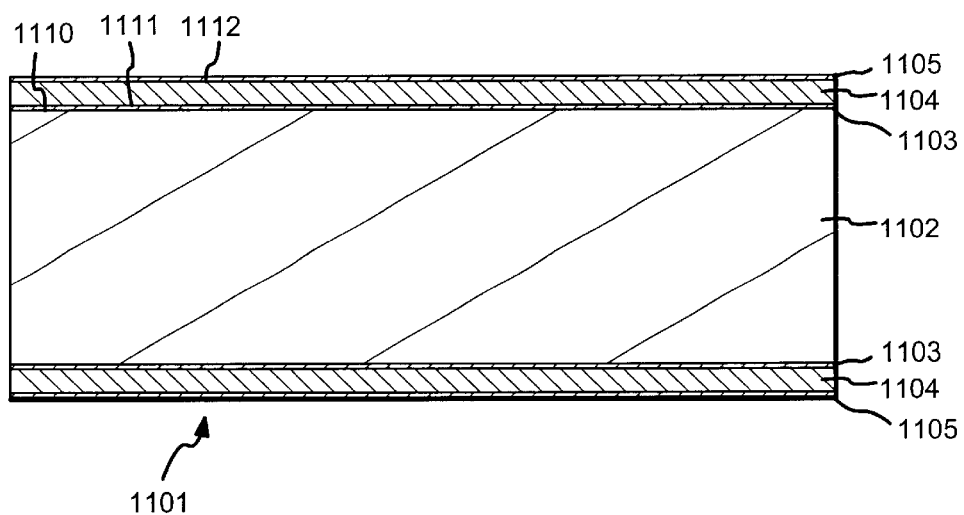
FIG. 11 is a cross-sectional view of an actuator arm of one embodiment of the present invention having inner conductive ground planes and outer conductive layers.

In a further embodiment of the present invention, the actuator arm may be assembled in such a manner so as to create a small amount of distributed capacitance, which can be used to provide additional high frequency noise decoupling to the pre-amplifier of the actuator assembly. One exemplary actuator arm is shown in FIG. 11. Actuator arm 1101 comprises a core layer(s) of fiber reinforced composite material 1102; conductive ground plane layers 1103 on both outer surfaces 1110 of core layer(s) 1102; dielectric layers 1104 on outer surfaces 1111 of conductive ground plane layers 1103; and conductive outer layers 1105 on both outer surfaces 1112 of dielectric layers 1104. Capacitance between a conductive ground plane layer 1103 and a conductive outer layer 1105, both of which are on the same side of the actuator arm, is given by the following equation:

$$C=(E_r \times E_o \times A)/d$$

where $E_r$ is the dielectric constant of the material in the dielectric layer 1104; $E_o$ is the permittivity constant; A is the area of intersection or overlap of conductive ground plane layer 1103 and conductive outer layer 1105; and d is the distance separating the conductive ground plane layer 1103 and the conductive outer layer 1105. By connecting conductive ground plane layer 1103 to a ground pin of the pre-amplifier and conductive outer layer 1105 to a power supply pin of the pre-amplifier, an amount of distributed capacitance, C, may be generated providing additional high frequency noise decoupling to the pre-amplifier.

By selecting a particular construction and materials, an amount of distributed capacitance may be created. Suitable dielectric materials include, but are not limited to, the fiber reinforced composite materials described above. Suitable materials for forming the conductive layers include, but are not limited to, any of the conductive materials described above. The overlapping area, A, between a conductive ground plane layer 1103 and a conductive outer layer 1105 may vary depending on the size and configuration of the actuator arm. In one embodiment of the present invention, overlapping area, A, is maximized by configuring an actuator arm such that both the conductive ground plane layer 1103 and the conductive outer layer 1105 occupy essentially all of the unoccupied surface area (i.e., area not occupied by other components, such as the pre-amplifier or conductors) of the actuator arm from the bearing shaft assembly opening to the distal end of the actuator arm. (For example, in the actuator arm 401 of FIG. 4, the overlapping area, A, may occupy the area of actuator arm 401 from flex circuit contacts 408 to FOS contacts 406 at the distal end of the actuator arm minus the area of opening 404 and conductors 405.) Further, d may vary depending on the actuator arm configuration. Desirably, d is up to about 0.030 inch (0.76 mm). More desirably, d is about 0.004 inch (0.10 mm). In one desired embodiment, the conductive layers are copper and the amount of distributed capacitance, C, created is about 40 pF.

An embodiment of the present invention is further directed to a method of making an integrated actuator assembly. The method comprises incorporating one or more electrical components of an actuator assembly into an actuator arm. The one or more electrical components may include a voice coil, one or more conductors, and other components, which are conventionally attached to outer surfaces of an actuator arm.

The method of making an actuator arm in an embodiment of the present invention may comprise one or more of the following steps: a design step; a prepreg laying-up step; a molding step; a deposition step; an etching step; a drilling step; and a washing step. Typically, an actuator arm construction is designed by selecting desired components, forming a mechanical outline, and determining the component placement within the actuator arm. An actuator arm deign is produced and forwarded to a fabrication group.

Figure 12:
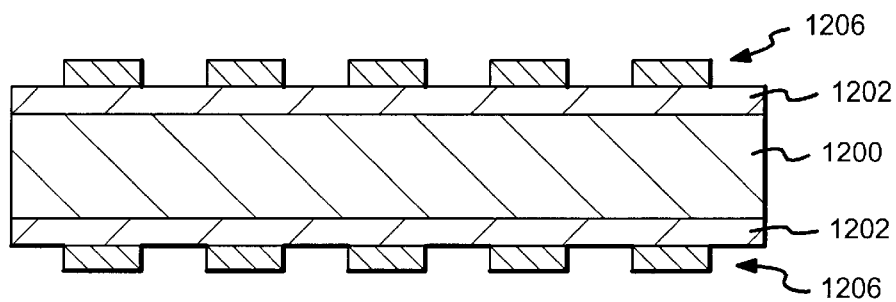
FIG. 12 is a cross-sectional view of an actuator arm construction at a particular stage in a fabrication process.

Various exemplary fabrication steps are displayed in FIGS. 12–16. FIG. 12 displays a core layer 1200, which desirably comprises fiber reinforced material formed in a prepreg laying-up process. Conductive layers 1202, which may comprise any conductive material including, but not limited to, aluminum, steel, beryllium, gold, silver, and copper, may be deposited on outer surfaces of core layer 1200 using deposition techniques known in the art including, but not limited to, sputter deposition, chemical vapor deposition, metal organic chemical vapor deposition, electroplating, electroless plating, adhesion and the like. Photoresist layers 1206 are then patterned upon conductive layers 1206 using techniques such as optical lithography. Portions of conductive layers 1202, which are not protected by a photoresist layer, are etched away to form a pattern of conductive material on outer surfaces of core layer 1200. The etching step may be performed by conventional methods such as a plasma etch process or by using the appropriate wet etch chemistry. A photoresist remover is then applied to photoresist layers 1206.

Figure 13:
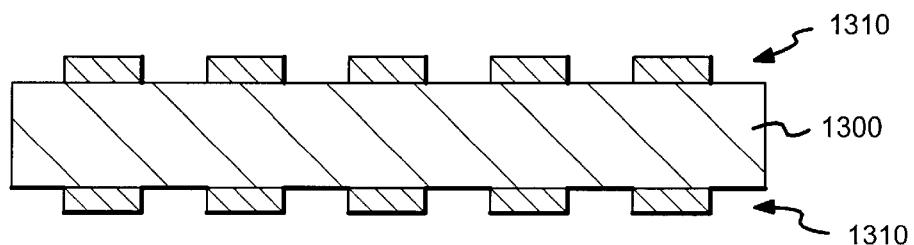
FIG. 13 is a cross-sectional view of an actuator arm construction at a particular stage in a fabrication process.

FIG. 13 displays a resulting core layer 1300 having a pattern of conductive material 1310 on outer surfaces of core layer 1300. Since the shape of the photoresist dictates the shape of electrical components 1310, the photoresist pattern may be pre-selected in the design phase to form the desired electrical components. The above process may be repeated to form multiple layers on core layer 1300.

Figure 14:
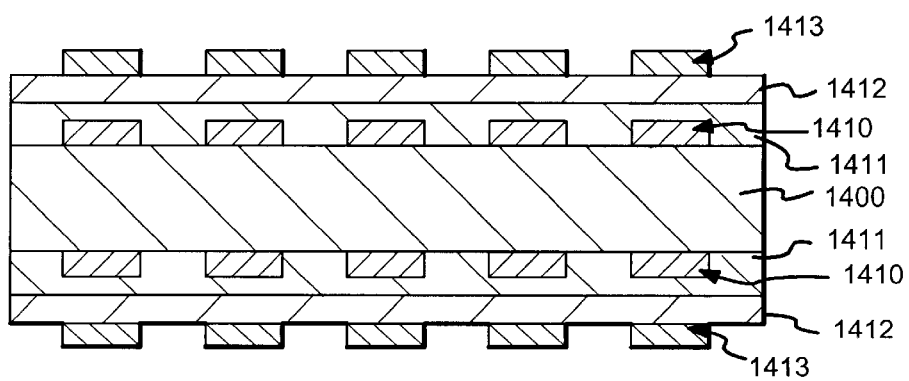
FIG. 14 is a cross-sectional view of an actuator arm construction at a particular stage in a fabrication process.

FIG. 14 depicts the formation of additional layers on a core layer 1400 of an actuator arm construction having a first pattern of conductive material 1410 thereon. Two layers of dielectric material 1411 comprising a fiber reinforced composite material are positioned onto conductive layers 1410. A second set of conductive layers 1412 are then positioned onto dielectric layers 1411. The assembly is then placed in a press and molded under a vacuum to bond the components together. After molding, a second pattern of photoresist layers 1413 are deposited onto second conductive layers 1412. The etching and photoresist steps described above are repeated to form a second layer of patterned conductive material on the actuator arm core layer 1400. The resulting actuator arm construction is shown in FIG. 15.

Figure 15:
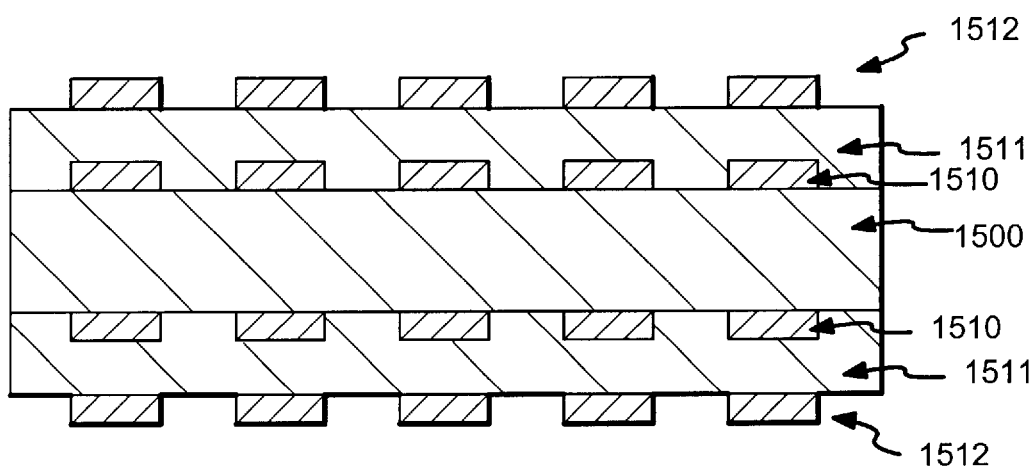
FIG. 15 is a cross-sectional view of an actuator arm construction at a particular stage in a fabrication process.

As shown in FIG. 15, the resulting actuator arm construction comprises a core layer 1500, layers of a first pattern of conductive material 1510 on an outer surface of core layer 1400, layers of dielectric material 1511 on outer surfaces of core layer 1500 and outer surfaces of conductive material 1510, and layers of a second pattern of conductive material 1512 on outer surfaces of dielectric material 1511.

Figure 16:
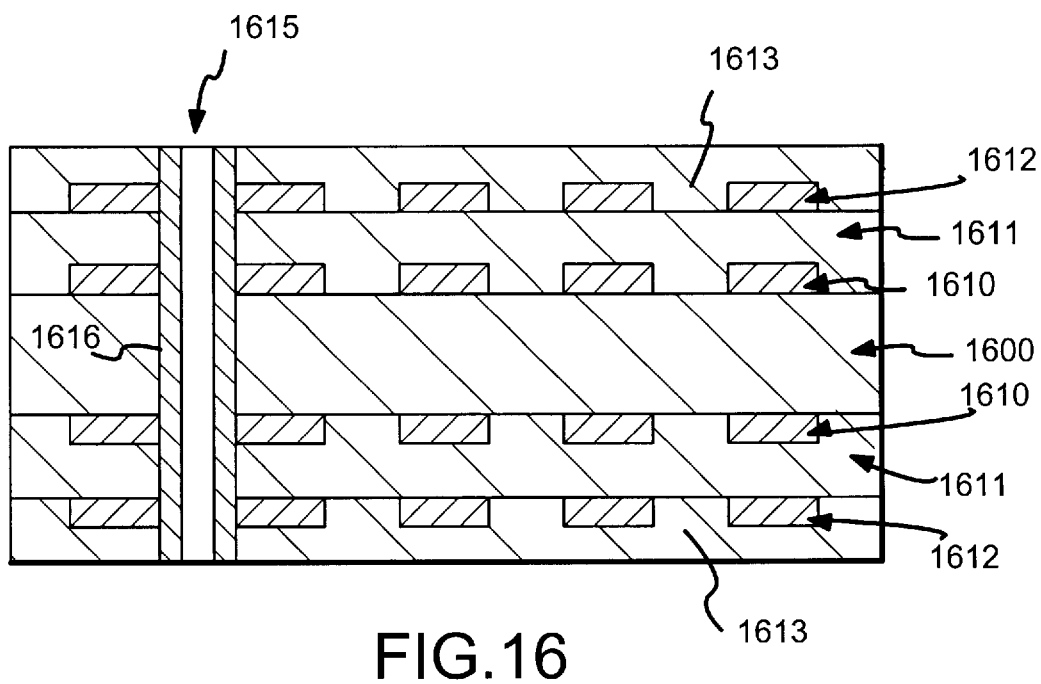
FIG. 16 is a cross-sectional view of an actuator arm construction at a particular stage in a fabrication process.

Turning to FIG. 16, an actuator arm construction is shown, wherein the actuator arm construction comprises a core layer 1600, layers of a first pattern of conductive material 1610 on an outer surface of core layer 1600, layers of dielectric material 1611 on outer surfaces of core layer 1600 and outer surfaces of conductive material 1610, layers of a second pattern of conductive material 1612 on outer surfaces of dielectric material 1611, and a second set of layers of dielectric material 1613 on outer surfaces of dielectric material 1611 and outer surfaces of conductive material 1612. The actuator arm construction further comprises one or more openings, such as opening 1615, which may be drilled vertically through the multi-layer structure at specific locations. The structure may then be placed in a plating bath to coat the surface of opening 1615 with a conductive material 1616, such as silver, copper, or gold. In this manner, the internal conductive layers 1611 are electrically connected to the outer conductive layers 1613.

While the actuator arm shown in FIG. 16 includes four conductive layers, it is to be understood that the depicted arm is only an example and that the actuator arm may include any number of conductive layers separated by dielectric layers. As a result of the fabrication process described above and other manufacturing techniques, the actuator arm may include one or more of the following components within its outer surfaces: a voice coil; a pre-amplifier for amplifying read signals generated by a head during a read operation; one or more conductors leading from the voice coil to an exterior surface of the actuator arm for connecting to a flex assembly; one or more conductors leading from the pre-amplifier to an exterior surface of the actuator arm for connecting to a flex assembly; and one or more conductors leading from the pre-amplifier to a head for controlling write currents applied to the head during a write operation. A head assembly may be attached to the actuator arm to form an actuator assembly. Desirably, the head assembly is attached to the actuator arm by a soldering step.

Embodiments of the present invention are also directed to a disc drive system comprising one or more discs and one or more actuator arms, wherein at least one actuator arm has an upper outer surface in a first plane having a first planar area, a lower outer surface in a second plane substantially parallel to the first plane and having a second planar area substantially equal to the first planar area, a peripheral outer surface substantially perpendicular to the first and second planes, and a voice coil embedded within the outer surfaces of the actuator arm.

In one embodiment of the present invention, the disc drive system comprises a single disc and one actuator arm having an upper outer surface in a first plane having a first planar area, a lower outer surface in a second plane substantially parallel to the first plane and having a second planar area substantially equal to the first planar area, a peripheral outer surface substantially perpendicular to the first and second planes, and a voice coil embedded within the outer surfaces of the actuator arm. The actuator arm of the disc drive system is desirably formed from a fiber-reinforced composite material.

Another embodiment of the present invention is directed to a method of reading data from a disc or writing data to a disc using a disc drive system comprising one or more discs and one or more actuator arms, wherein at least one actuator arm has an upper outer surface in a first plane having a first planar area, a lower outer surface in a second plane substantially parallel to the first plane and having a second planar area substantially equal to the first planar area, a peripheral outer surface substantially perpendicular to the first and second planes, and a voice coil embedded within the outer surfaces of the actuator arm.

In summary, an embodiment of the present invention is directed to an actuator arm (such as 200) having an upper outer surface in a first plane having a first planar area, a lower outer surface in a second plane substantially parallel to the first plane and having a second planar area substantially equal to the first planar area, a peripheral outer surface substantially perpendicular to the first and second planes, and a voice coil (such as 208) embedded within the outer surfaces of the actuator arm. The actuator arm may comprise two or more layers of fiber-reinforced composite material. Each layer of fiber-reinforced composite material may comprise a fibrous material and a matrix material. The fibrous material may comprise a woven fabric, a non-woven web or mat, unidirectionally arranged monofilaments or fibers, yarns, roving, chopped fiber, pulp, spun-laced sheet, wet-laid paper, or a combination thereof. The fibrous material may comprise carbon, graphite, aramid, glass, quartz, silicon carbide, boron, alumina, metal-coated carbon, stainless steel, copper, nickel, or a combination thereof; and the matrix material may comprise acetal resin, polyamide, polyimide, polyamide imide, polyether imide, polyether, polyester, polycarbonate, polyarylene sulfide, polysulfone, polyarylsulfone, polketone, polyolefin, vinyl, acrylic, epoxy resin, polyester resin, polyimide resin, phenolic resin, or a combination thereof. Desirably, the fibrous material comprises glass fibers and the matrix material comprises an epoxy resin.

The actuator arm of one embodiment of the present invention may contain one or more of the following components within outer surfaces of the actuator arm: a pre-amplifier (such as 214) for amplifying read signals generated by a head (such as 118) during a read operation; one or more conductors (such as 210) leading from a voice coil (such as 208) to an exterior surface of the actuator arm (such as 200) forming contacts (such as 212) for connecting to a flex assembly (such as 130); one or more conductors (such as 216) leading from the pre-amplifier to an exterior surface of the actuator arm forming contacts (such as 212) for connecting to a flex assembly; and one or more conductors (such as 218) leading from the pre-amplifier to an exterior surface of the actuator arm forming contacts (such as 220) for connecting to a head assembly, wherein the conductors enable electrical connection for controlling write currents applied to the head during a write operation and read currents generated by the head during a read operation.

The actuator arm of an embodiment the present invention may include a pre-amplifier (such as 904) mounted on a lower outer surface of the actuator arm. The pre-amplifier may be positioned within an opening (such as 905) in the actuator arm. The actuator arm may further include a thermal heat sink/stiffener (such as 907) positioned over the pre-amplifier (such as 904) and mounted on an upper outer surface of the actuator arm. In an embodiment of the present invention, the actuator arm comprises a pre-amplifier (such as 904); a head assembly; one or more conductors leading from the pre-amplifier to an exterior surface of the actuator arm for connecting to a flex assembly (such as 711); and one or more conductors leading from the pre-amplifier to an exterior surface of the actuator arm for connecting to the head assembly (such as 405); wherein the pre-amplifier, the head assembly, and the conductors are all mounted on a bottom surface of the actuator arm.

Embodiments of the present invention are also directed to an actuator arm assembly that comprises an actuator arm (such as 715) and a flex circuit (such as 711) connected to the actuator arm, wherein the flex circuit has a bend (such as 717) therein of about 90 degrees or less. The actuator arm may comprise a core layer (such as 1102), at least one conductive ground plane layer (such as 1103) on an outer surface of the core layer, at least one dielectric layer (such as 1104) on an outer surface of the at least one conductive ground plane layer, and at least one conductive outer layer (such as 1105) on an outer surface of the at least one dielectric layer. Desirably, the at least one conductive ground plane layer and the at least one conductive outer layer are electrically connected to power supply pins of a pre-amplifier. In one embodiment, the actuator arm of the present invention may have an overall length of less than about 10 cm (about 4 inches), an overall width of less than about 5 cm (about 2 inches), and a thickness of less than about 3 mm (about 0.12 inches).

Embodiments of the present invention may be directed to a method of making an actuator arm, wherein the method comprises (1) forming a core layer of fiber reinforced composite material; (2) forming one or more layers of conductive material on the core layer; (3) forming a dielectric material layer on each of the one or more layers of conductive material to separate the conductive layers from one another; and (4) forming vertical electrical connections between two or more of the layers of conductive material.

The method may further comprise mounting a pre-amplifier on a lower outer surface of the actuator arm. The method may also comprise mounting a thermal heat sink/stiffener on an upper outer surface of the actuator arm.

Embodiments of the present invention may be directed to a disc drive system (such as 100) comprising (a) at least one disc (such as 108), and (b) at least one at least one actuator arm (such as 200) having an upper outer surface in a first plane having a first planar area, a lower outer surface in a second plane substantially parallel to the first plane and having a second planar area substantially equal to the first planar area, a peripheral outer surface substantially perpendicular to the first and second planes, and a voice coil (such as 208) embedded within the outer surfaces of the actuator arm. The actuator arm (such as 200) in the disc drive system (such as 100) may further include one or more of the following components within outer surfaces of the actuator arm: a pre-amplifier (such as 218) for amplifying read signals generated by a head (such as 118) during a read operation; one or more conductors (such as 210) leading from the voice coil (such as 208) to an exterior surface of the actuator arm for connecting to a flex assembly (such as 130); one or more conductors (such as 216) leading from the pre-amplifier (such as 218) to an exterior surface of the actuator arm for connecting to a flex assembly (such as 130); and one or more conductors leading from the pre-amplifier (such as 218) to a head (such as 118) for controlling write currents applied to the head during a write operation.

An embodiment of the present invention may further be directed to a method of reading data from a disc or writing data to a disc using a disc drive system comprising (a) at least one disc, and (b) at least one actuator arm having an upper outer surface in a first plane having a first planar area, a lower outer surface in a second plane substantially parallel to the first plane and having a second planar area substantially equal to the first planar area, a peripheral outer surface substantially perpendicular to the first and second planes, and a voice coil (such as 208) embedded within the outer surfaces of the actuator arm.

Embodiments of the present invention are described above by way of examples, which are not to be construed in any way as imposing limitations upon the scope of the invention. On the contrary, it is to be clearly understood that resort may be had to various other embodiments, modifications, and equivalents thereof which, after reading the description herein, may suggest themselves to those skilled in the art without departing from the spirit of the present invention and/or the scope of the appended claims.

It will be clear that the present invention is well adapted to attain the ends and advantages mentioned as well as those inherent therein. While a presently preferred embodiment has been described for purposes of this disclosure, various changes and modifications may be made which are well within the scope of the present invention. Numerous other changes may be made which will readily suggest themselves to those skilled in the art and which are encompassed in the spirit of the invention disclosed and as defined in the appended claims.

What is claimed is:

1. An actuator arm having an upper outer surface in a first plane having a first planar area, a lower outer surface in a second plane substantially parallel to the first plane and having a second planar area substantially equal to the first planar area, a peripheral outer surface substantially perpendicular to the first and second planes, and a voice coil embedded within the outer surfaces of the actuator arm.

2. The actuator arm of claim 1, wherein the actuator arm comprises two or more layers of fiber-reinforced composite material.

3. The actuator arm of claim 2, wherein each layer of fiber-reinforced composite material comprises a fibrous material and a matrix material.

4. The actuator arm of claim 3, wherein the fibrous material comprises at least one of a woven fabric, a non-woven web or mat, unidirectionally arranged monofilaments or fibers, yarns, roving, chopped fiber, pulp, spun-laced sheet, and wet-laid paper.

5. The actuator arm of claim 3, wherein the fibrous material comprises at least one of carbon, graphite, aramid, glass, quartz, silicon carbide, boron, alumina, metal-coated carbon, stainless steel, copper, and nickel; and the matrix material comprises at least one of an acetal resin, polyamide, polyimide, polyamide imide, polyether imide, polyether, polyester, polycarbonate, polyarylene sulfide, polysulfone, polyarylsulfone, polketone, polyolefin, vinyl, acrylic, epoxy resin, polyester resin, polyimide resin, and phenolic resin.

6. The actuator arm of claim 5, wherein the fibrous material comprises glass fibers and the matrix material comprises an epoxy resin.

7. The actuator arm of claim 1, wherein the actuator arm contains one or more of the following components within the outer surfaces of the actuator arm: a pre-amplifier for amplifying read signals generated by a head during a read operation; one or more conductors leading from the voice coil to an exterior surface of the actuator arm for connecting to a flex assembly; one or more conductors leading from the pre-amplifier to an exterior surface of the actuator arm for connecting to a flex assembly; and one or more conductors leading from the pre-amplifier to an exterior surface of the actuator arm for connecting to a head assembly.

8. The actuator arm of claim 1, wherein the actuator arm comprises a pre-amplifier mounted on lower outer surface of the actuator arm.

9. The actuator arm of claim 8, wherein the pre-amplifier is positioned within an opening in the actuator arm.

10. The actuator arm of claim 9, wherein the actuator arm further comprises a thermal heat sink/stiffener positioned over the pre-amplifier and mounted on the upper outer surface of the actuator arm.

11. The actuator arm of claim 1, wherein the actuator arm comprises a pre-amplifier; a head assembly; one or more conductors leading from the pre-amplifier to an exterior surface of the actuator arm for connecting to a flex assembly; and one or more conductors leading from the pre-amplifier to an exterior surface of the actuator arm for connecting to the head assembly; wherein the pre-amplifier, the head assembly, and the conductors are all mounted on a bottom surface of the actuator arm.

12. An actuator arm assembly comprising the actuator arm of claim 11 and a flex circuit connected to the actuator arm, wherein the flex circuit has a bend therein of about 90 degrees or less.

13. The actuator arm of claim 1, wherein the actuator arm comprises a core layer, a pre-amplifier, at least one conductive ground plane layer on an outer surface of the core layer, at least one dielectric layer on an outer surface of the at least one conductive ground plane layer, and at least one conductive outer layer on an outer surface of the at least one dielectric layer; wherein the at least one conductive ground plane layer is electrically connected to a ground pin of the pre-amplifier and the at least one conductive outer layer is electrically connected to a power supply pin of the pre-amplifier.

14. The actuator arm of claim 1, wherein the actuator arm has an overall length of less than about 10 cm (about 4 inches), an overall width of less than about 5 cm (about 2 inches), and a thickness of less than about 3 mm (about 0.12 inches).

15. A disc drive comprising:

at least one disc, and a fiber reinforced means for supporting a transducer over selected portions of the disc and carrying a voice coil operable to position the transducer over the selected portions of the disc wherein the fiber reinforced means comprises at least one actuator arm having an upper outer surface in a first plane having a first planar area, a lower outer surface in a second plane substantially parallel to the first plane and having a second planar area substantially equal to the first planar area, a peripheral outer surface substantially perpendicular to the first and second planes, with the voice coil embedded within the outer surfaces of the actuator arm.

16. The disc drive system of claim 15, wherein the actuator arm comprises two or more layers of fiber-reinforced composite material, and one or more of the following components within the outer surfaces of the actuator arm: a pre-amplifier for amplifying read signals generated by a head during a read operation; one or more conductors leading from the voice coil to an exterior surface of the actuator arm for connecting to a flex assembly; one or more conductors leading from the pre-amplifier to an exterior surface of the actuator arm for connecting to a flex assembly; and one or more conductors leading from the pre-amplifier to an exterior surface of the actuator arm for connecting to a head assembly.

17. The disc drive according to claim 15 wherein the actuator arm comprises two or more layers of a fiber-reinforced composite material.

18. The disc drive according to claim 17 wherein each layer of fiber-reinforced composite material comprises a fibrous material and a matrix material.

19. The disc drive of claim 18, wherein the fibrous material comprises at least one of a woven fabric, a non-woven web or mat, unidirectionally arranged monofilaments or fibers, yarns, roving, chopped fiber, pulp, spun-laced sheet, and wet-laid paper.

20. The disc drive of claim 19 wherein the fibrous material comprises at least one of carbon, graphite, aramid, glass, quartz, silicon carbide, boron, alumina, metal-coated carbon, stainless steel, copper, and nickel; and the matrix material comprises at least one of an acetal resin, polyamide, polyimide, polyamide imide, polyether imide, polyether, polyester, polycarbonate, polyarylene sulfide, polysulfone, polyarylsulfone, polketone, polyolefin, vinyl, acrylic, epoxy resin, polyester resin, polyimide resin, and phenolic resin.

21. The disc drive of claim 19 wherein the fibrous material comprises fibers and the matrix material comprises an epoxy resin.

22. The disc drive of claim 15, wherein the actuator arm contains one or more of the following components within the outer surfaces of the actuator arm: a pre-amplifier for amplifying read signals generated by a head during a read operation; one or more conductors leading from the voice coil to an exterior surface of the actuator arm for connecting to a flex assembly; one or more conductors leading from the pre-amplifier to an exterior surface of the actuator arm for connecting to a flex assembly; and one or more conductors leading from the pre-amplifier to an exterior surface of the actuator arm for connecting to a head assembly.

23. The disc drive of claim 15, wherein the actuator arm comprises a pre-amplifier mounted on lower outer surface of the actuator arm.

* * * * *

UNITED STATES PATENT AND TRADEMARK OFFICE
CERTIFICATE OF CORRECTION

PATENT NO. : 6,678,121 B2
DATED : January 13, 2004
INVENTOR(S) : Lee et al.

It is certified that error appears in the above-identified patent and that said Letters Patent is hereby corrected as shown below:

Title page,
Item [56], References Cited, U.S. PATENT DOCUMENTS, patent No. "6,404,596" has date "6/2002", should be -- 7/2002 --

Column 15,
Line 16, "polketone" should be -- polyketone --

Column 16,
Line 47, polketone" should be -- polyketone --
Line 50, "comprises fibers" should be -- comprises glass fibers --

Signed and Sealed this

Fifteenth Day of June, 2004

JON W. DUDAS
*Acting Director of the United States Patent and Trademark Office*